United States Patent
Wu et al.

(10) Patent No.: US 6,221,747 B1
(45) Date of Patent: Apr. 24, 2001

(54) METHOD OF FABRICATING A CONDUCTIVE PLUG WITH A LOW JUNCTION RESISTANCE IN AN INTEGRATED CIRCUIT

(75) Inventors: Juei-kuo Wu, Hsin-Chuang; Kuen-Chu Chen, Hsinchu Hsien; Weng-Yi Chen, Chupei, all of (TW)

(73) Assignees: United Integrated Circuits Corp.; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/347,610

(22) Filed: Jul. 2, 1999

(51) Int. Cl.[7] .................................................... H01L 21/44
(52) U.S. Cl. ........................ 438/597; 438/514; 438/533; 438/565; 438/637; 438/783
(58) Field of Search ................................... 438/533, 565, 438/597, 637, 684, 783, 514

(56) References Cited

U.S. PATENT DOCUMENTS

| | | | |
|---|---|---|---|
| 5,470,794 | * | 11/1995 | Anjum et al. .................... 438/528 |
| 5,620,926 | * | 4/1997 | Itoh ................................ 438/530 |
| 5,909,048 | * | 6/1999 | Sugino ............................ 257/522 |
| 5,998,255 | * | 12/1999 | Kung et al. ...................... 438/252 |
| 6,096,391 | * | 8/2000 | Muffoletto et al. .............. 427/580 |

* cited by examiner

Primary Examiner—Carl Whitehead, Jr.
Assistant Examiner—Toniae M. Thomas
(74) Attorney, Agent, or Firm—Oppenheimer, Wolff & Donnelly, LLP

(57) ABSTRACT

An integrated circuit (IC) fabrication method is provided for fabricating a conductive plug, such as a contact plug or a via plug, with a low junction resistance in an integrated circuit. This method is characterized by the inclusion of a preliminary doping process to form a doped region in the exposed area through the contact opening or via opening. By conventional method, the exposed area would be formed with an undesired oxide layer or laid with undesired reactant remnants after the etching process for forming the contact opening or via opening. When being subjected to a high temperature during the subsequent deposition process, the dopant atoms in the doped region diffuse into these undesired insulative matters, thereby reducing the junction resistance of the resulting contact or via plug.

13 Claims, 1 Drawing Sheet

METHOD OF FABRICATING A CONDUCTIVE PLUG WITH A LOW JUNCTION RESISTANCE IN AN INTEGRATED CIRCUIT

BACKGROUND OF THE INVENTION

1. Field of the Invention

This invention relates to integrated circuit (IC) fabrication technology, and more particularly, to a method of fabricating a conductive plug, such as a contact plug or a via plug, with a low junction resistance in an integrated circuit.

2. Description of Related Art

High-density integrated circuits, such as VLSI (Very Large Scale Integration) ICs, are typically formed with a multi-level interconnect structure including two or more levels of metallization layers for electrically interconnecting the various components in the integrated circuits. A multi-level interconnect structure includes a base layer of metallization layer which is electrically connected to the source/drain regions of the MOS transistors formed in the integrated circuit, and at least a second layer of metallization layer which is separated from the base layer of metallization layer by an insulating layer, with the second layer of metallization layer being electrically connected to the base layer of metallization layer via a conductive plug formed in the insulating layer. Still another or more layers of metallization layers can be formed over the second layer of metallization layer to constitute the multi-level interconnect structure.

It is to be noted that, in the literature of IC fabrication, the term "contact plug" customarily refers to a conductive plug that is interconnected between an upper level of metallization layer and a conductive part in the substrate, such as a source/drain region of a MOS transistor, whereas the term "via plug" refers to a conductive plug that is interconnected between an upper level of metallization layer and a lower level of metallization layer. In this specification, the two terms "contact plug" and "via plug" are collectively referred to as "conductive plug".

One drawback to the conventional method for fabricating a conductive plug, however, is that undesired insulative materials exist at the junction between the plug and its connected part, thus resulting in a high junction resistance that causes a high resistance-capacitance (RC) time delay to the signal being transmitted through the plug. This degrades the performance of the resulting IC device.

A conventional method for fabricating a contact plug comprises forming an insulating layer on a provided substrate, performing a photolithography and etching process to form an opening within a insulating layer exposing a part of the substrate, and forming a doped polysilicon layer as a plug in the opening.

One drawback to the foregoing process, however, is that the resistance of the junction between the resulting plug and the substrate undesirably high due to two reasons. First, after the etching process used to form the opening, a small amount of the reactant used in the etching process is left at the bottom of the resulting opening and these remnants are considerably high in electrical resistance. Second, a thin oxide layer grows on the exposed surface of the substrate due to exposure to oxygen through the opening and the oxide layer is also considerably high in electrical resistance. These unwanted insulative materials undesirably increase the junction resistance of the resulting plug, thus causing an RC (resistance-capacitance) delay in the signal being transmitted through the plug. The performance of the resulting IC devices is therefore degraded.

SUMMARY OF THE INVENTION

The invention provides a method for fabricating a conductive plug with a low junction resistance in an integrated circuit. A semiconductor substrate is provided. The substrate has a conductive region therein, such as a source/drain region or a metallization layer. An insulating layer with an opening at a specified location therein is formed over the substrate. The opening in the insulating layer exposes the conductive region. A second insulating layer, such as a native oxide layer or a remaining insulating layer, is positioned on the conductive region within the opening. A doping process is performed to dope a selected dopant into the second insulating layer on the conductive region through the opening so as to convert the second insulating layer into a doped region. The resistance of the second insulating layer is thus decreased. A depositing process is performed to deposit polysilicon into the via opening and over the second insulating layer to form the intended plug, wherein the deposition process being performed at a high-temperature that can cause the dopant atoms in the doped region to diffuse.

The method of the invention is characterized by the inclusion in the doping process of formation of a doped region in the exposed area through the contact opening or via opening. In the conventional method, the exposed area would be formed with an undesired oxide layer or laid with undesired reactant remnants after the etching process for forming the contact opening or via opening. When subjected to high-temperature conditions during subsequent deposition process, the dopant atoms in the doped region would diffuse into these undesired insulative matters, thereby reducing the junction resistance of the resulting contact or via plug.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a novel method for fabricating a conductive plug, such as a contact plug or a via plug, with a low junction resistance. In accordance with the invention, the preferred embodiment is directed to the fabrication of a contact plug, which is described with reference to FIGS. 1A–1B.

Figure 1A:
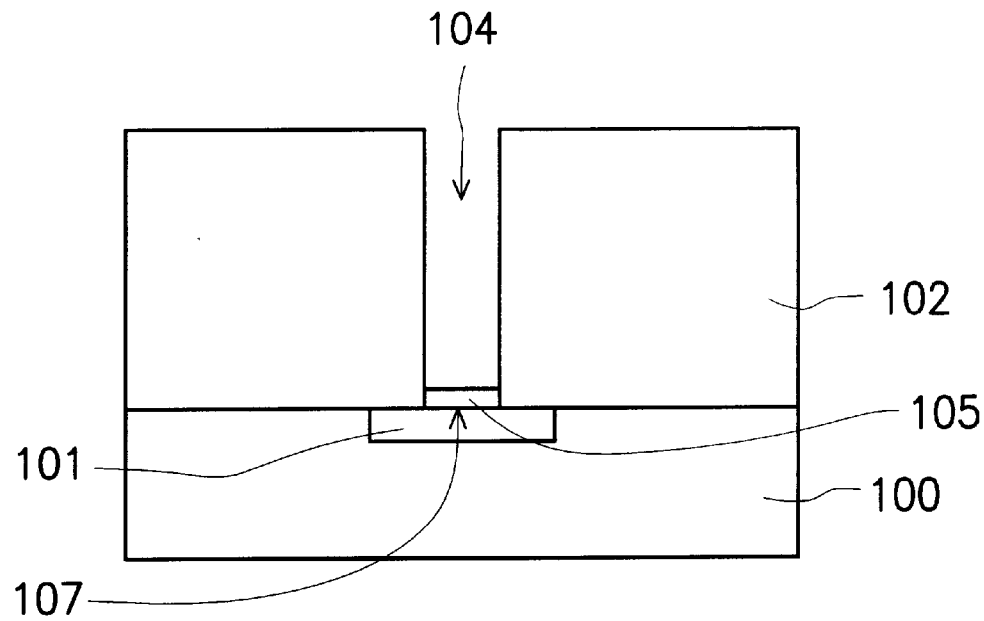
FIGS. 1A–1B are schematic, cross-sectional diagrams used to depict a preferred embodiment of the method of the invention for fabricating a contact plug with a low junction resistance in an integrated circuit.
Figure 1B:
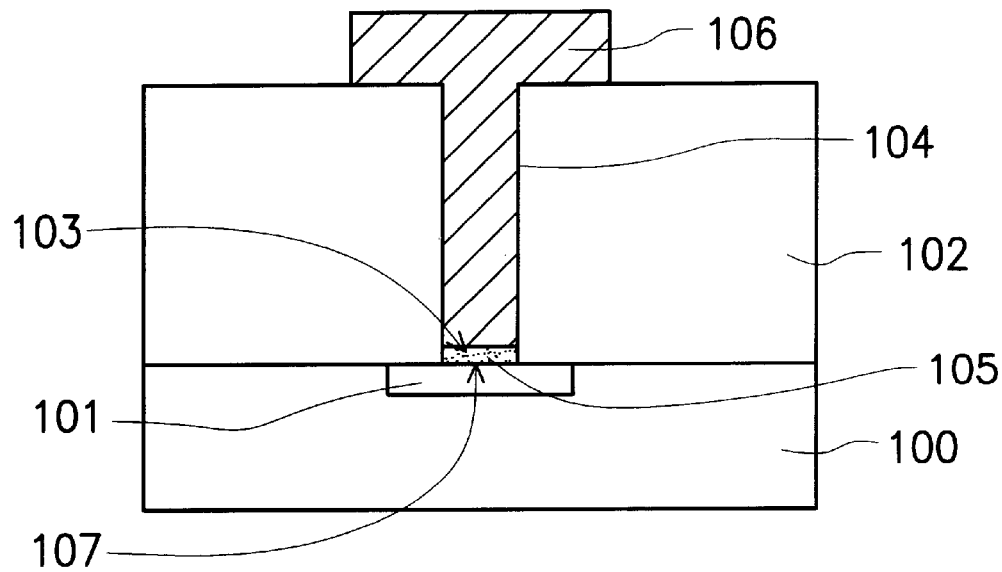

FIGS. 1A–1B are schematic, cross-sectional diagrams used to depict the preferred embodiment of the method of the invention for fabricating a contact plug with a low junction resistance in an integrated circuit.

Referring first to FIG. 1A, a semiconductor substrate 100, such as a silicon substrate, is prepared. This substrate 100 is then formed with a MOS transistor (not shown) at a specified location. A conductive region 101, such as a source/drain region of the MOS transistor or a wiring line, is formed in the substrate 100. Next, an first insulating layer 102 is formed over the substrate 100, preferably from silicon oxide through a CVD (chemical-vapor disposition) process. Subsequently, a opening 104 is formed at a specified location in the first insulating layer 102 to expose the conductive region 101 within the substrate 100.

The opening 104 is formed to expose the conductive region 101 by etching a part of the first insulating layer 102. As mentioned in the background section of this specification, the exposed area 107 of the substrate 100 through the opening 104 comes in contact with the oxygen in the ambient atmosphere, thereby forming a thin native oxide layer over the exposed area 107. Moreover, the reactant used in the etching process used to form the contact opening 104 is left over the exposed area 107. The existence of these two unwanted insulative matters leads to a high junction resistance problem. To help eliminate the high junction resistance problem, a characteristic step of the invention performs a preliminary doping process so as to dope a dopant of the opposite semiconductor type into the MOS transistor in the second insulating layer 105 over the substrate 100.

In the case of the MOS transistor being N-type, for example, phosphorus is used as the dopant, which is doped into the second insulating layer 105 by placing the entire wafer in a chamber filled with gaseous $PH_3$ and set at a temperature of from 400° C. to 1000° C. and a pressure of from 0.1 torr to 100 torr, so as to form a phosphorus-doped layer 103 with a concentration of from $1 \times 10^9$ to $1 \times 10^{21}$ atoms/$cm^2$ in the exposed area 107 of the substrate 100 by, for example, CVD. In the case of the MOS transistor being P-type, for example, boron is used as the dopant.

Referring next to FIG. 1B, in the subsequent step, polysilicon is deposited into the opening 104 and over the first insulating layer 102 through a CVD process at a temperature of from 500° C. to 650° C. The deposited polysilicon is then doped in-situ (meaning that the wafer undergoes the doping process in the same chamber) so as to increase the conductivity thereof. After this, the doped polysilicon is selectively removed, with the remaining part 106 serving as the intended contact plug.

During this process, the high-temperature condition causes the phosphorus atoms in the phosphorus-doped layer 103 over the exposed area 107 to diffuse into the undesired native oxide layer and reactant remnants even into the substrate 100, thereby reducing the resistance of these insulative matters. The high-temparature condition also can be a thermal process, such as annealing or rapid thermal process. As a result, the junction resistance between the resulting contact plug 106 and the substrate 100 can be reduced compared to the prior art. Furthermore, the phosphorus atoms are deposited by CVD so that the uniformity of the phosphorus atoms is not affected from the aspect ratio of the opening 104.

In conclusion, the invention provides a method for fabricating a conductive plug, such as a contact plug or a via plug, with a low junction resistance in an integrated circuit. By this method, the junction resistance can be reduced irrespective of the aspect ratio of the plug. Moreover, the method has the benefit of allowing the preliminary doping process to be performed in situ, meaning that the doping process can be performed in the same chamber used to perform the etching process for forming the contact opening and via opening, which allows the overall fabrication process to be simplified.

The invention has been described using exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a conductive plug with a low junction resistance, comprising the steps of:
   preparing a semiconductor substrate at least comprising a conductive region;
   forming an insulating layer over the substrate;
   forming a contact opening at a specified location in the insulating layer to expose a part of the conductive region, wherein a native oxide layer is formed on the exposed conductive region;
   performing a preliminary doping process to dope a selected dopant into the native oxide layer through the contact opening so as to form a doped region in the exposed area of the substrate; and
   performing a depositing process to deposit polysilicon into the contact opening, over the insulating layer, and over the doped native oxide layer to form the intended conductive plug, the deposition process being performed at a high-temperature that can cause the dopant atoms in the doped region to diffuse.

2. The method according to claim 1, wherein the conductive type of the dopant used in the doping process and the conductive type of the substrate are opposite.

3. The method according to claim 2, wherein the doping process is performed with the use of gaseous $PH_3$ as reactant when the dopant comprises phosphorus.

4. The method according to claim 2, wherein the doping process is performed at a temperature of from 400° C. to 1000° C.

5. The method according to claim 2, wherein the doping process is performed under a pressure of from 0.1 torr to 100 torr.

6. The method according to claim 1, wherein the doped region is doped to a dopant concentration of from $1 \times 10^{19}$ to $1 \times 10^{21}$ atoms/$cm^2$.

7. A method of fabricating a conductive structure with a low junction resistance, comprising the steps of:
   providing a conductive layer with a native oxide layer formed thereon; and
   performing a doping and drive-in process to dope a dopant into the native oxide layer to reduce the resistance of the native oxide layer and forming a conductive layer over the doped native oxide layer.

8. The method according to claim 7, wherein the doping and drive-in process comprises the steps of:
   doping a dopant into the native oxide layer through the opening; and
   performing a thermal process to diffuse the dopant.

9. The method of claim 7, wherein the dopant used in the doping process is phosphorus.

10. The method of claim 9, wherein the doping process is performed with the use of gaseous $PH_3$ as reactant.

11. The method of claim 9, wherein the doping process is performed at a temperature of from 400° C. to 1000° C.

12. The method of claim 7, wherein the the doping is performed to a dopant concentration of from $1 \times 10^{19}$ to $1 \times 10^{21}$ atoms/$cm^2$.

13. The method of claim 7, wherein the dopant used in the doping process is boron.

* * * * *